(12) United States Patent
Rozman et al.

(10) Patent No.: US 9,479,105 B2
(45) Date of Patent: Oct. 25, 2016

(54) INPUT EMI FILTER FOR MOTOR DRIVE INCLUDING AN ACTIVE RECTIFIER

(71) Applicant: Hamilton Sundstrand Corporation, Charlotte, NC (US)

(72) Inventors: Gregory I. Rozman, Rockford, IL (US); Francis A. Carcia, Enfield, CT (US); Gabriel Ackerman, Manchester, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 14/175,121

(22) Filed: Feb. 7, 2014

(65) Prior Publication Data
US 2015/0145461 A1    May 28, 2015

Related U.S. Application Data
(60) Provisional application No. 61/907,426, filed on Nov. 22, 2013.

(51) Int. Cl.
| | | |
|---|---|---|
| *H02P 1/32* | (2006.01) | |
| *H02P 3/20* | (2006.01) | |
| *H02P 7/06* | (2006.01) | |
| *H02P 23/00* | (2016.01) | |
| *H02P 25/00* | (2006.01) | |
| *H02P 27/00* | (2006.01) | |
| *H02P 29/00* | (2016.01) | |

(Continued)

(52) U.S. Cl.
CPC .......... *H02P 29/0038* (2013.01); *H02M 1/12* (2013.01); *H02M 1/44* (2013.01); *H04B 3/28* (2013.01); *H04B 3/30* (2013.01); *G01R 19/2509* (2013.01); *G01R 19/2513* (2013.01); *G01R 31/007* (2013.01); *H02M 2001/123* (2013.01); *H04B 2203/5475* (2013.01)

(58) Field of Classification Search
CPC .......... G01R 19/2509; G01R 19/2513; G01R 31/007; H02J 1/10; H02J 1/14
USPC .......................................... 318/496
See application file for complete search history.

(56) References Cited

U.S. PATENT DOCUMENTS 5,311,419 A * 5/1994 Shires ................ H02M 1/4216
                                                                363/129
6,075,425 A    6/2000 Gopfrich et al.
(Continued)

FOREIGN PATENT DOCUMENTS

EP          1990900        11/2008

OTHER PUBLICATIONS

European Search Report dated Apr. 8, 2015 for application No. 14193689.8.

*Primary Examiner* — Shawki S Ismail
*Assistant Examiner* — Bradley Brown
(74) *Attorney, Agent, or Firm* — Carlson, Gaskey & Olds, P.C.

(57) ABSTRACT

A poly-phase motor drive includes an input EMI filter having a poly-phase filter input and a poly-phase filter output and an active rectifier connected to the filter output. The input EMI filter includes notch filters tuned at active rectifier and motor drive inverter switching frequencies and diverts common-mode current into DC bus. The active rectifier has a DC output. A motor drive inverter is connected to the DC output. The motor drive inverter has a poly-phase motor control output.

11 Claims, 3 Drawing Sheets

(51) Int. Cl.
  *H04B 3/28* (2006.01)
  *H04B 3/30* (2006.01)
  *H02M 1/44* (2007.01)
  *G01R 19/25* (2006.01)
  *G01R 31/00* (2006.01)
  *H02M 1/12* (2006.01)

(56) References Cited

U.S. PATENT DOCUMENTS

| | | | |
|---|---|---|---|
| 7,068,005 B2 | 6/2006 | Baker | |
| 7,994,876 B2 | 8/2011 | Feng et al. | |
| 8,115,444 B2 | 2/2012 | De et al. | |
| 8,160,172 B2 | 4/2012 | Zhang et al. | |
| 8,174,810 B2 | 5/2012 | Tallam et al. | |
| 8,223,468 B2 | 7/2012 | Januszewski et al. | |
| 8,325,500 B2 * | 12/2012 | Schueneman | 363/47 |
| 2007/0120607 A1 | 5/2007 | Pelly | |
| 2008/0037298 A1 * | 2/2008 | Lafontaine | 363/47 |
| 2008/0278109 A1 * | 11/2008 | Qian | H02M 1/126 318/803 |
| 2009/0303652 A1 * | 12/2009 | Tallam et al. | 361/111 |
| 2011/0141774 A1 * | 6/2011 | Kane | H02M 1/126 363/37 |

* cited by examiner

INPUT EMI FILTER FOR MOTOR DRIVE INCLUDING AN ACTIVE RECTIFIER

CROSS REFERENCE TO RELATED APPLICATION

This application claims priority to U.S. Provisional Application No. 61/907,426 which was filed on Nov. 22, 2013.

STATEMENT REGARDING GOVERNMENT SUPPORT

This invention was made with government support under Contract No. N65540-080D-0017 DP 0001 awarded by the United States Navy. The Government has certain rights in this invention.

TECHNICAL FIELD

The present invention relates generally to motor drives including active rectifiers, and more specifically to a motor drive including an input electromagnetic interference (EMI) filter.

BACKGROUND

Electric engine start systems utilize a motor drive (a switching-mode power conversion system) to control a motor/starter and employ an active rectifier as a front-end power converter to interface with a power supply. The active rectifier draws near sinusoidal currents from the power supply to meet specification requirements on input current harmonics. Both the active rectifier and the motor drive inverter employ fast switching IGBT devices controlled using a pulse-width modulation (PWM) technique. The high frequency voltage components of PWM converter (the active rectifier) and inverter cause high frequency leakage currents and conducted EMI in the power lines and ground system.

The conducted EMI can be classified into two-types: common-mode (CM) and differential-mode (DM) according to their circulation paths. The noise flowing within the power-feeding paths is called DM noise, and the noise flowing between the power conversion system and the ground is called CM noise. Typical EMI filters consist of an input section connected between the active rectifier and the power source, and an output section connected between the drive inverter and the motor. Both sections include DM and CM inductors, capacitors and resistors. The output section reduces high-frequency leakage currents due to parasitic motor winding capacitances to ground, as well as bearing currents, and shaft voltage. The radiated emissions are controlled by shielding drive inverter power lines to the motor.

In some systems the motor drive inverter operates at higher output current in comparison to the active rectifier input current that results in a larger weight of EMI filter output section. As an alternative to the excessive weight of EMI filter output section, some systems that operate a motor drive (i.e. engine start) at low duty cycle and utilize shielded output cable to the motor have implemented additional common mode filtering in the EMI filter input section to address additional CM noise contributed by the motor windings capacitive coupling to the ground.

For safety reasons common mode filters do not use an increased total capacitance to ground for filtering. Instead, common mode filters use an increased inductance of at least one common mode choke in a multi-stage common mode filter in order to increase the insertion loss of the common mode filter. This construction makes the common mode filter bulky.

SUMMARY OF THE INVENTION

Disclosed is a poly-phase motor drive including: an input EMI filter having a poly-phase filter input and a poly-phase filter output, an active rectifier connected to the filter output, the active rectifier having a DC output, and a motor drive inverter connected to the DC output, the motor drive inverter having a poly-phase motor control output.

Also disclosed is a method for filtering a poly-phase motor drive including: filtering common mode noise from the switching-mode power conversion system, and filtering differential mode noise from the switching-mode power conversion system.

These and other features of the present invention can be best understood from the following specification and drawings, the following of which is a brief description.

DETAILED DESCRIPTION OF AN EMBODIMENT

In existing motor drives, the motor current of the motor drive (the output of the motor drive) is typically higher than the input line current (the input to the active rectifier). An EMI filter at the output of the motor drive must be sized to accommodate the increased motor current resulting in a large physical size of the common mode filter. The higher current requirement of the motor drive inverter requires a lower switching frequency in order to reduce inverter switching losses and improve the thermal performance of the inverter. The lower switching frequency and higher current characteristics of the motor drive inverter lead to an increased size requirement for an output EMI filter.

Figure 1:
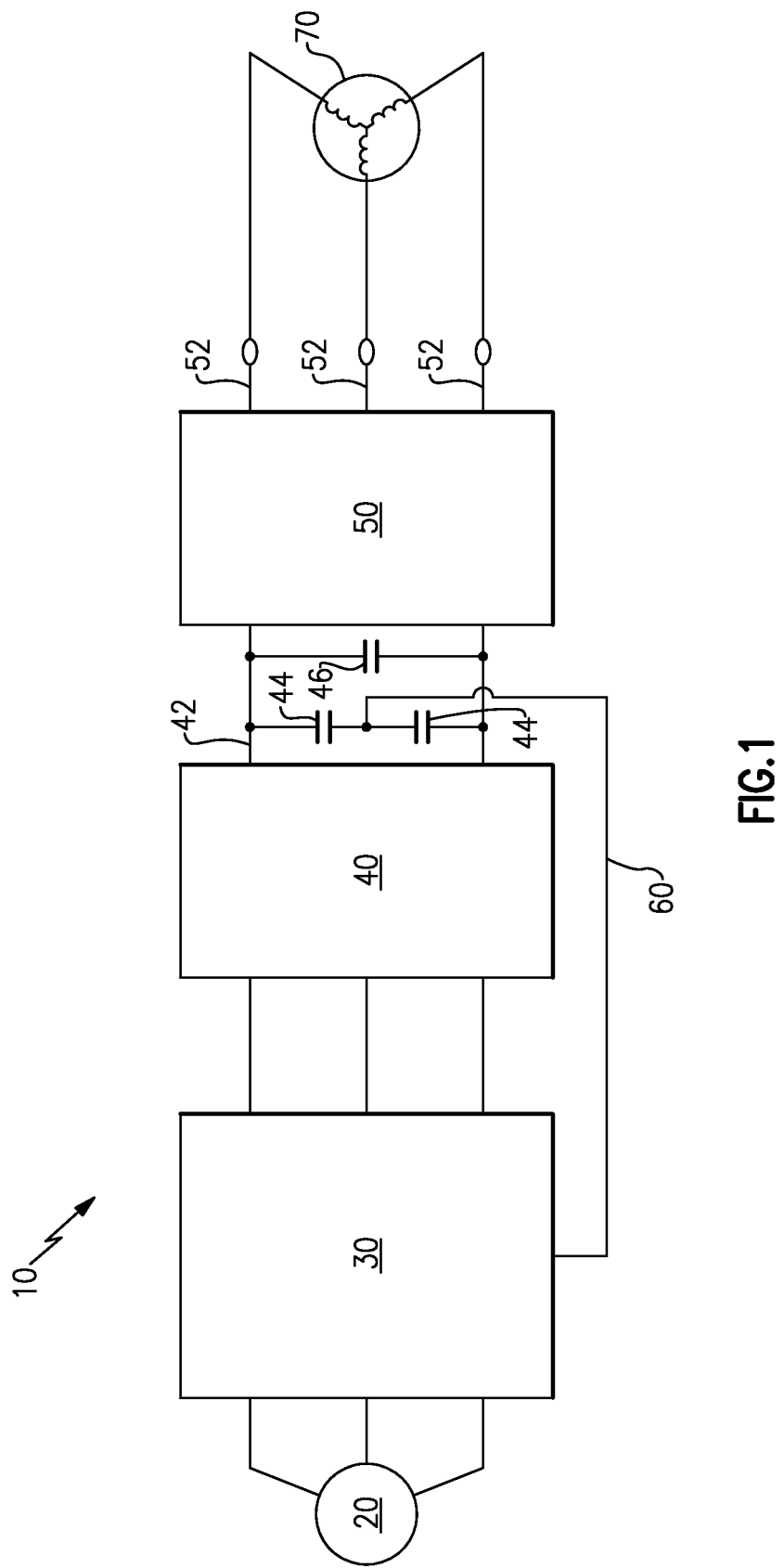
FIG. 1 schematically illustrates a motor drive system including an active rectifier.

FIG. 1 schematically illustrates a motor drive 10 including an active rectifier 40 and a motor drive inverter 50 that addresses the above increased size and weight requirements by incrementally increasing an input EMI filter 30 at the active rectifier 40 input and eliminating EMI filtering at the motor drive inverter 50 output. A three phase power source 20 provides electrical power to the motor drive 10. The current from the three phase power source 20 is passed through the input EMI filter 30 to the active rectifier 40. The active rectifier 40 comprises a conventional six-switch voltage source PWM converter and a three-phase boost inductor. In one example, the active rectifier 40 converts a three-phase AC input power into 750 volts DC output power at DC link 42. The switching-mode active rectifier 40 generates high frequency (HF) voltage components that cause HF leakage currents and conducted electromagnetic interference (EMI) noise which flows within power-feeding paths, and between the power conversion system and the ground.

The DC link 42 is connected to an input of the motor drive inverter 50. The motor drive inverter 50, in turn, converts the received DC input power into a three phase AC output power on lines 52 to power the motor 70. The motor drive inverter 50 includes a conventional six-switch voltage source PWM inverter. The switching-mode inverter generates high frequency (HF) voltage components that cause HF leakage currents and conducted electromagnetic interference (EMI) noise which flows within power-feeding paths, and between the power conversion system and the ground. Due to the low-duty cycle utilization of the motor drive system for engine start applications, concerns related to the bearing currents and shaft voltage are reduced, while the common-mode noise associated with the high-frequency leakage currents due to motor windings capacitive coupling to the ground are addressed by incrementally increasing size of the input EMI filter.

In some examples, the switching frequency of the active rectifier 40 and the motor drive inverter 50 are the same and introduce the same frequency of common mode noise into the system. In alternate examples, the switching frequencies are different (i.e. the inverter 50 switching frequency may be lower in comparison to the active rectifier 40 switching frequency in order to reduce inverter switching losses when operating the inverter 50 at higher output current levels), and introduce different frequencies of common mode noise into the system.

In the example of FIG. 1, the DC link 42 includes two DC link mid-point capacitors 44 connecting the terminals of the DC link 42. A bulk capacitor 46 is arranged in parallel to the two DC link mid-point capacitors 44. A floating point connection 60 connects the input EMI filter 30 to the DC link mid-point capacitors 44.

Figure 2:
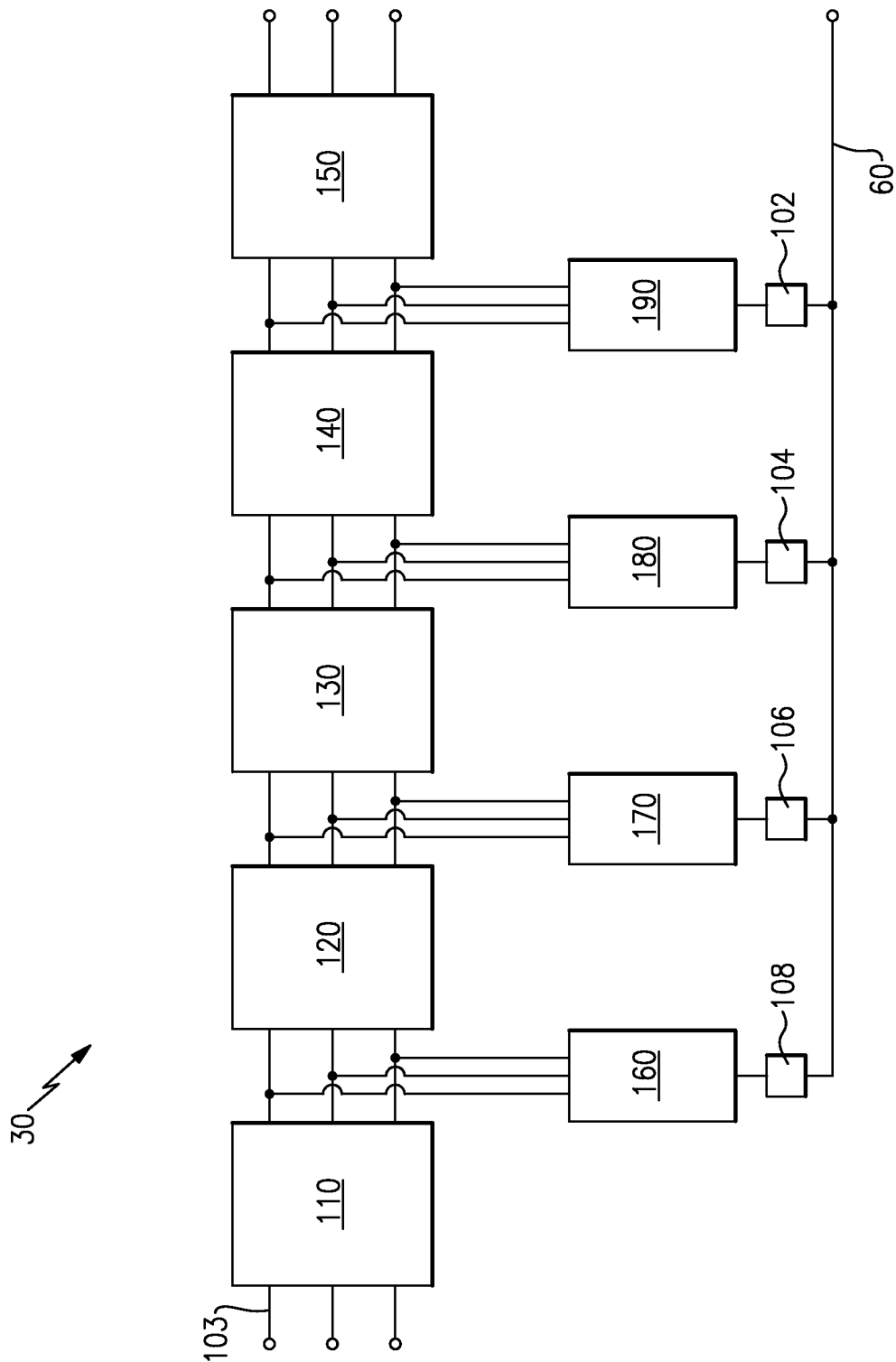
FIG. 2 schematically illustrates an example input EMI filter for a motor drive system.

FIG. 2 illustrates a first example input EMI filter 30 that can be used in the motor drive 10 of FIG. 1. The input EMI filter 30 includes three phase inputs 103 that connect the three phase power source 20 (illustrated in FIG. 1) to a high frequency CM choke 110. The high frequency CM choke 110 utilizes a feed-through ferrite toroid and filters out high frequency common mode noise originating from the switching-mode motor drive system 10.

The output of the high frequency CM choke 110 is connected to a differential mode noise filter 120 and a first notch filter 160. The differential mode noise filter 120 uses a differential mode inductor on each phase to filter out differential mode noise originating from the switching-mode motor drive system 10. The first notch filter 160 includes an inductor in series with a capacitor on each phase. The notch filter arrangement filters out noise at the particular switching frequency to which the notch filter 160 is turned. The output of the first notch filter 160 is connected to the floating point connection 60 via an impedance block 108.

The output of the differential mode noise filter 120 is connected to a first common mode choke 130 that utilizes a three-phase common mode inductor. Also connected to the output of the differential mode noise filter 120 is a second notch filter 170. As with the first notch filter 160, the second notch filter 170 includes an inductor in series with a capacitor on each phase and filters out noise at the particular switching frequency to which the second notch filter 170 is turned. The second notch filter 170 is connected to the floating point connection 60 via an impedance block 106.

The output of the first common mode choke 130 is connected to a second common mode choke 140. As with the first common mode choke 130, the second common mode choke 140 includes a three-phase common mode inductor. In some example embodiments, the core material of the common mode inductors of the first common mode choke 130 and the core material of the common mode inductors of the second common mode choke 140 are different core materials. In further examples, the core material of the common mode inductors in one of the common mode chokes 130, 140 is a ferrite material, and the core material in the other of the common mode chokes 130, 140 is a nano-crystalline materials. The utilization of varied core materials within the common mode inductors of the common mode chokes 130, 140 allows the input EMI filter 30 to realize benefits of each type of common mode inductor simultaneously.

Also connected to the output of the second common mode choke 130 is a common mode capacitor 180. The common mode capacitor 180 includes a capacitor on each phase and provides additional filtering. The three phases of the common mode capacitor 180 are tied together and connected to the floating point connection 60 via an impedance block 104.

Connected to the output of the second common mode choke 140 is a boost inductor 150. The boost inductor 150 is part of the active rectifier 40 and includes at least one inductor on each phase of the active rectifier 40. Also connected between the boost inductor 150 and the second CM choke 140 is a differential mode (DM) capacitor/resistor 190 that includes a series connected capacitor and a damping resistor per phase. The boost inductor 150, DM capacitor 190, DM inductor 120, and the first notch filter 160 are a differential mode filter that reduces active rectifier differential mode noise and improves input current harmonic distortions. The first notch filter 160 is tuned to reject current components associated with active rectifier 40 switching frequency. The differential mode capacitor/resistor 190 is connected to the floating point connection 60 via an impedance block 102.

The arrangement of the differential mode inductor 120, the boost inductor 150, and the differential mode capacitor 190 is referred to as a T-type differential mode filter. Each of the differential mode inductor 120, the boost inductor 150, and the differential mode capacitor 190 operate in conjunction to provide differential mode filtering of the input to the active rectifier 40. Similarly, the common mode elements 110, 130, 140, and 180 operate in conjunction with each other to filter common mode noise.

Figure 3:
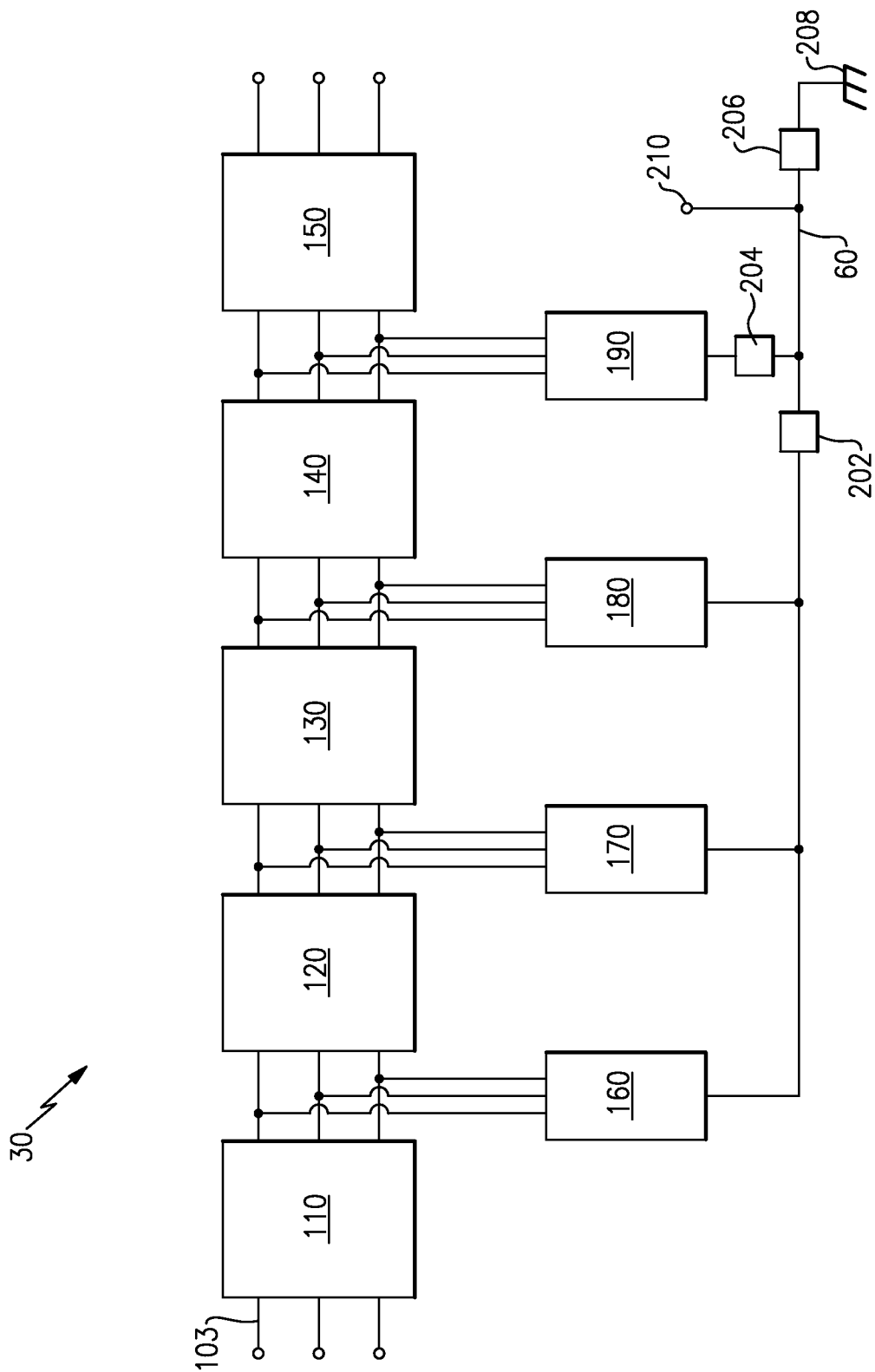
FIG. 3 schematically illustrates an alternate example input EMI filter for a motor drive system.

With continued reference to FIGS. 1 and 2, and with like numerals indicating like elements, FIG. 3 illustrates an alternate arrangement for the input EMI filter 30 of FIG. 1. The alternate arrangement varies from the arrangement of FIG. 2 in that the first and second common mode chokes 130, 140 and the common mode capacitor filter 180 are connected to a single impedance block 202 and the single impedance block 202 connects to the floating point connection 60. The differential mode capacitor/resistor 190 is connected to the floating point connection 60 via an impedance block 204, and the floating point connection 60 is connected to a neutral 208 via an impedance block 206. In both the illustrated examples of FIG. 2 and FIG. 3, the floating point connection 60 is connected to the DC link 42 mid-point as illustrated in FIG. 1.

In a typical example, the impedance blocks 102, 104, 106, 108, 202, 204, 206 are resistive/capacitive (RC) elements. The specific resistances and capacitances of the impedance blocks 102, 104, 106, 108, 202, 204, 206 depend on the needs of the specific system to divert common mode current into DC bus, and can be determined by one of skill in the art having the benefit of this disclosure.

As described above, the active rectifier 40 and the motor drive inverter 50 each operate at a given switching frequency emitting EMI noise associated with these switching frequencies. By way of example, in one motor drive 10 the active rectifier 40 operates at 11 kHz and the motor drive inverter 50 operates at 8 kHz. Thus, additional EMI noise will be injected into the system at both 8 kHz and 11 kHz. Each of the notch filters 160, 170 are tuned to one of the switching frequencies to filter out the EMI noise in that particular frequency.

In alternate systems where the active rectifier 40 and the motor drive inverter 50 are switched at the same frequency, both notch filters 160, 170 can be tuned to the same frequency, or one of the notch filters 160, 170 can be omitted entirely. While the notch filters 160, 170 are described herein as a "first notch filter 160" and a "second notch filter 170" it is understood that in a practical implementation the notch filters 160, 170 are interchangeable and either notch filter 160, 170 can be tuned to either switching frequency.

While the above motor drive 10 is described and illustrated with regards to a three phase motor drive input filter arrangement, one of skill in the art having the benefit of this disclosure will recognize that the motor drive input filter can be adapted to any poly-phase motor drive and still fall within the above disclosure.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A poly-phase motor drive comprising:
an input filter having a poly-phase filter input and a poly-phase filter output, wherein the input filter includes a high-frequency common mode inductor connected to the poly-phase filter input, a plurality of common mode filter components connected to the high-frequency common mode inductor, and a differential mode damped inductive capacitance filter interconnected with the common mode filter components;
an active rectifier including a boost inductor, the active rectifier is connected to the filter output and has a DC output;
a motor drive inverter connected to the DC output, the motor drive inverter having a poly-phase motor control output;
wherein the differential mode filter is a T-type LC filter;
wherein the common mode filter components include a high frequency common mode inductor and are connected to a first shunt-type notch filter; and
wherein the common mode filter further comprises a first common mode choke inductor and a second common mode choke inductor, wherein said first common mode choke inductor has a first core material and said second common mode choke inductor has a second core material.

2. The poly-phase motor drive of claim 1, wherein said first shunt type notch filter is tuned to a switching frequency of the active rectifier.

3. The poly-phase motor drive of claim 2, further comprising a second shunt-type notch filter, and wherein the second shunt type notch filter is tuned to a switching frequency of the motor drive inverter.

4. The poly-phase motor drive of claim 3, wherein the switching frequency of the first shunt-type notch filter and the switching frequency of the second shunt-type notch filter are different frequencies.

5. The poly-phase motor drive of claim 1, wherein the first core material is a nanocrystalline material, and the second core material is a ferrite material.

6. A poly-phase motor drive comprising:
an input filter having a poly-phase filter input and a poly-phase filter output;
an active rectifier including a boost inductor, the active rectifier is connected to the filter output and has a DC output;
a motor drive inverter connected to the DC output, the motor drive inverter having a poly-phase motor control output; and
wherein the input filter comprises:
a high frequency common-mode choke connected to said poly-phase filter input and having a poly-phase high frequency common-mode choke output;
a differential mode inductor block connected to said poly-phase high frequency common-mode choke output and having a poly-phase differential mode inductor block output;
a first notch filter connected to the poly-phase high frequency common-mode choke output;
a second notch filter connected to the poly-phase differential mode inductor block output;
a first common mode choke connected to the poly-phase differential mode inductor block output and having a poly-phase first common mode choke output;
a common mode capacitor connected to the poly-phase first common mode choke output;
a second common mode choke connected to the poly-phase first common mode choke output and having a poly-phase second common mode choke output; and
a differential mode capacitor/resistor block connected to said poly-phase second common mode choke output having an output of said poly-phase filter output.

7. The poly-phase motor drive of claim 6, wherein
said first notch filter is connected to a common floating point connection via a first impedance block;
said second notch filter is connected to the common floating point connection via a second impedance block
said common mode capacitor is connected to the common floating point connection via a third impedance block
said differential mode capacitor block is connected to the common floating point connection via a fourth impedance block, and
said common floating point is connected to DC bus mid-point capacitors.

8. The poly-phase motor drive of claim 6, wherein
each of said first notch filter, said second notch filter, and said common mode capacitor are connected to a floating point connection via a first impedance block;
said differential mode capacitor block is connected to said common floating point connection via a second impedance block;
said floating point connection is connected to a neutral via a third impedance block, and
said second impedance block is connected to DC bus mid-point capacitors.

9. A method for filtering a poly-phase motor drive comprising:
filtering common mode noise at an input of an active rectifier by passing a received input signal through a first common mode choke constructed with a first core material and passing said received input signal through a second common mode choke constructed with a second core material different from said first core material; and
filtering differential mode noise at an input of the active rectifier.

10. The method of claim 9, wherein the step of filtering differential mode noise at the input of the active rectifier comprises filtering differential mode noise in a first frequency band corresponding to a switching frequency of the active rectifier using a first notch filter.

11. The method of claim 9, wherein the step of filtering differential mode noise at the input of the active rectifier comprises filtering differential mode noise in a second frequency band corresponding to a switching frequency of a motor drive inverter using a second notch filter.

* * * * *